United States Patent
Bowen

(10) Patent No.: US 8,259,982 B2
(45) Date of Patent: Sep. 4, 2012

(54) REDUCING ACOUSTIC COUPLING TO MICROPHONE ON PRINTED CIRCUIT BOARD

(75) Inventor: James Samuel Bowen, Santa Clara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1540 days.

(21) Appl. No.: 11/787,657

(22) Filed: Apr. 17, 2007

(65) Prior Publication Data

US 2008/0260181 A1 Oct. 23, 2008

(51) Int. Cl.
*H04R 1/02* (2006.01)
(52) U.S. Cl. ........ 381/354; 381/111; 381/162; 381/368; 381/372; 455/425; 455/550.1
(58) Field of Classification Search ............... 455/550.1, 455/575.1, 114.2, 423, 425; 381/111, 162, 381/345, 353, 354, 355, 361, 368, 372–375, 381/386, 413, 429
See application file for complete search history.

(56) References Cited

U.S. PATENT DOCUMENTS

| | | | |
|---|---|---|---|
| 4,039,760 A * | 8/1977 | Gregory et al. | 455/462 |
| 4,720,857 A * | 1/1988 | Burris et al. | 379/430 |
| 5,389,917 A * | 2/1995 | LaManna et al. | 340/5.51 |
| 5,937,361 A * | 8/1999 | Smith | 455/575.1 |
| 6,137,883 A * | 10/2000 | Kaschke et al. | 379/433.07 |
| 6,842,879 B1 * | 1/2005 | Jochym et al. | 716/137 |
| 7,375,431 B1 * | 5/2008 | Patwardhan et al. | 257/773 |
| 7,519,175 B2 * | 4/2009 | Suzuki et al. | 379/420.01 |
| 7,843,021 B2 * | 11/2010 | Zhe et al. | 257/416 |
| 2003/0103641 A1 * | 6/2003 | Marten | 381/386 |
| 2003/0139782 A1 * | 7/2003 | Duncan et al. | 607/48 |
| 2005/0207605 A1 * | 9/2005 | Dehe et al. | 381/369 |
| 2006/0116180 A1 * | 6/2006 | Minervini | 455/575.1 |
| 2007/0026905 A1 * | 2/2007 | Murray | 455/570 |
| 2007/0046636 A1 * | 3/2007 | Nam | 345/169 |
| 2007/0116261 A1 * | 5/2007 | Hawker et al. | 379/419 |
| 2008/0165999 A1 * | 7/2008 | Dinh et al. | 381/361 |

* cited by examiner

*Primary Examiner* — Jinsong Hu
*Assistant Examiner* — Magdi Elhag

(57) ABSTRACT

A mobile computing device comprises a printed circuit board, a processing circuit, a surface mount microphone, and a vibration attenuation portion. The processing circuit is disposed on a first portion of the printed circuit board. The surface mount microphone is disposed on a second portion of the printed circuit board. The vibration attenuation portion of the board is configured to attenuate vibrations from the first to the second portion of the printed circuit board.

16 Claims, 8 Drawing Sheets

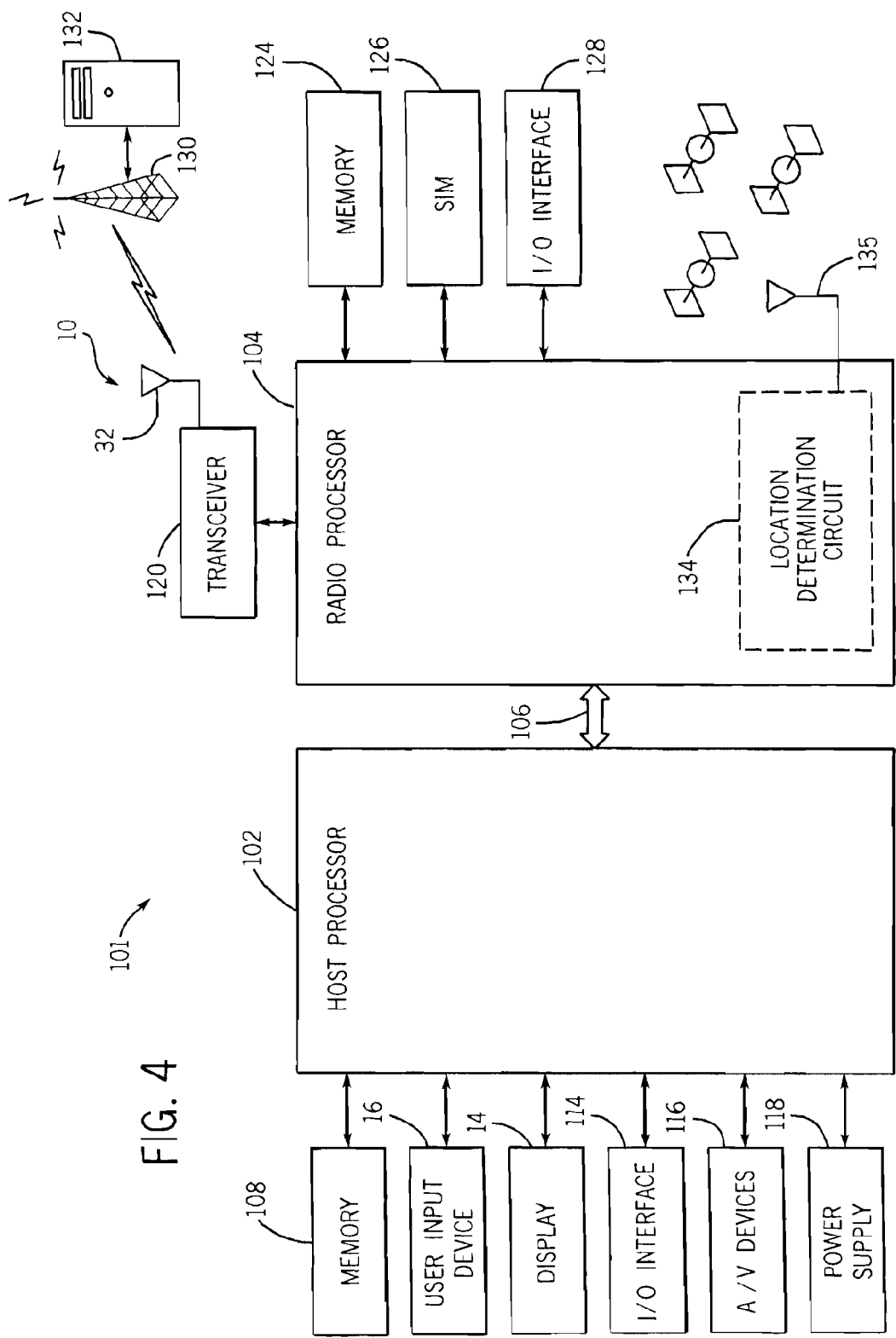

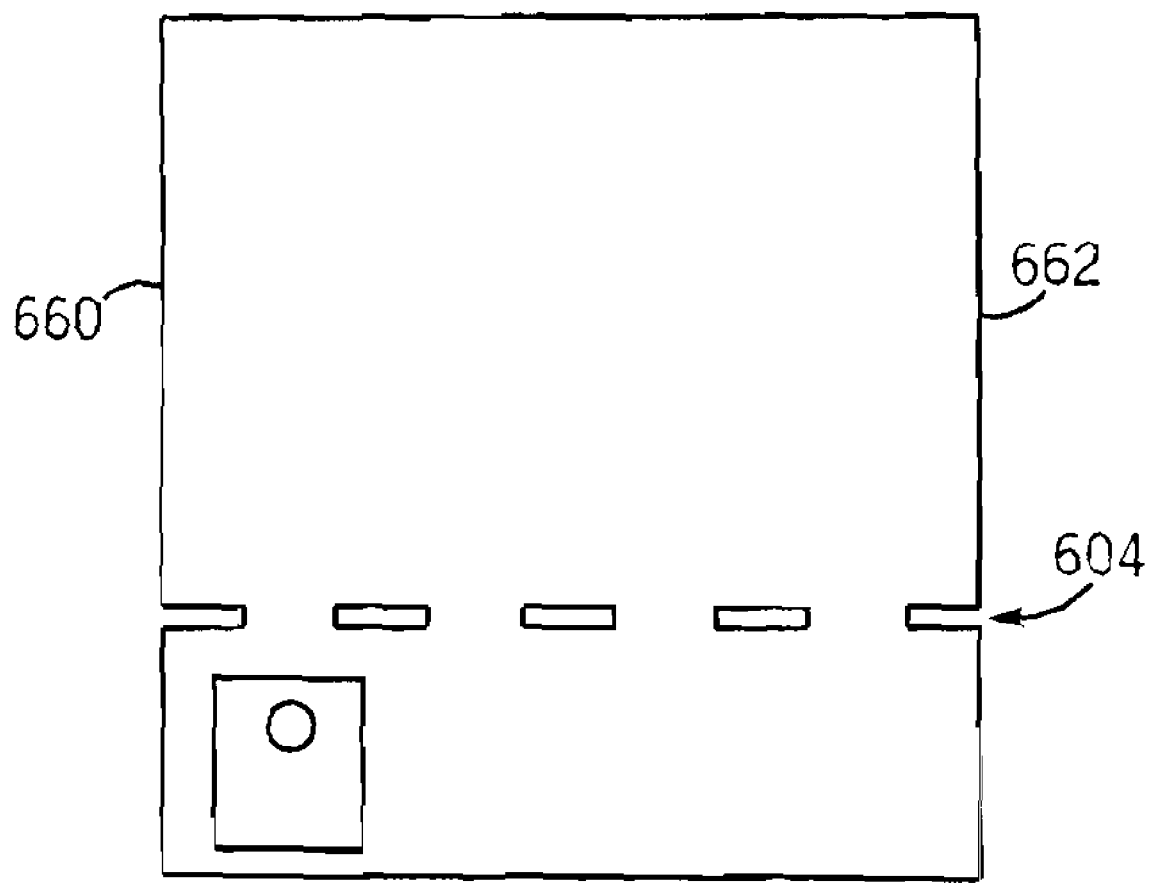

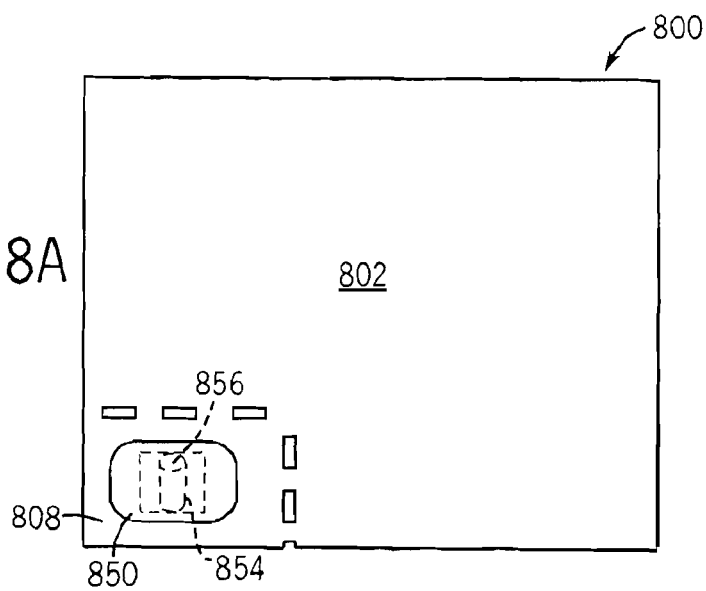
FIG. 8A
FIG. 8B
FIG. 8C

REDUCING ACOUSTIC COUPLING TO MICROPHONE ON PRINTED CIRCUIT BOARD

BACKGROUND

Microphones are used in a variety of electronic devices such as mobile telephones and wireless headsets. When mounted on a printed circuit board, microphones may pick up noise and vibration from the housing of the electronic device when a user presses keys, handles the phone, etc. This is especially true with surface-mount microphones.

One approach is to mount the microphone on a separate, daughter PCB and couple the daughter PCB to the main PCB by a flex circuit. However, this approach can have drawbacks in the areas of cost, reliability, manufacturing and size.

Accordingly, what is needed is a system and method for reducing acoustic coupling to a microphone on a printed circuit board. Further what is needed is a system and method for reducing acoustic coupling between a microphone and a printed circuit board with improved manufacturability, reliability, cost and/or packaging.

The teachings herein extend to those embodiments which fall within the scope of the appended claims, regardless of whether they accomplish one or more of the above-mentioned needs.

BRIEF DESCRIPTION OF THE DRAWINGS

FIG. 4 is a block diagram of the mobile computing device of FIGS. 1 and 2, according to an exemplary embodiment;

FIGS. 6A-6G are illustrations of various exemplary embodiments of printed circuit boards;

FIGS. 8A-8C are a top, a side, and bottom view of a PCB with a shock absorbing substrate, according to an exemplary embodiment.

DETAILED DESCRIPTION OF THE EXEMPLARY EMBODIMENTS

Figure 1:
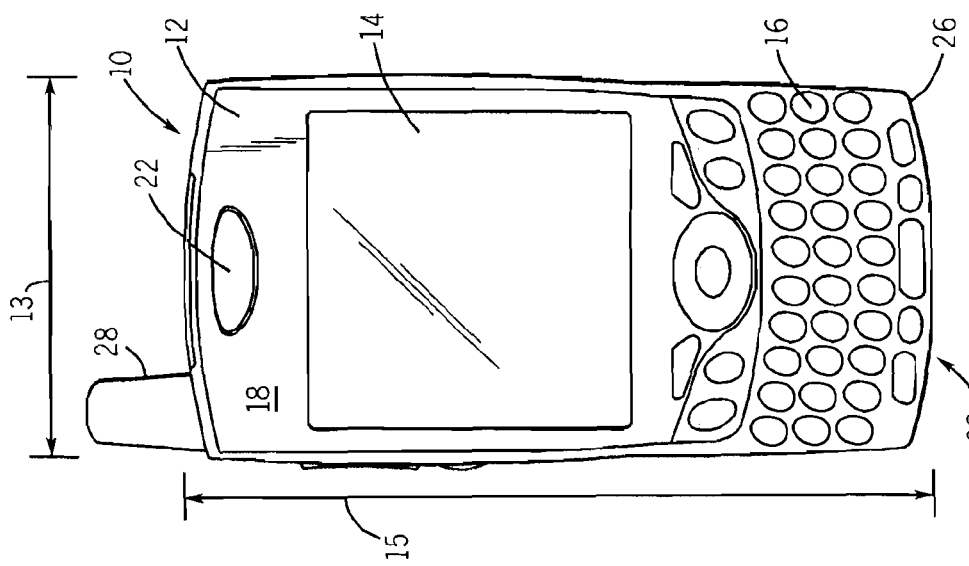
FIG. 1 is a front view of a mobile computing device, according to an exemplary embodiment.

Referring first to FIG. 1, a mobile computing device 10 is shown. Device 10 is a smart phone, which is a handheld computer comprising both mobile telephone and personal digital assistant functionality. A handheld computer is a computer small enough to be carried in a user's hand while the device is in use, which would include typical mobile telephones and personal digital assistants, but exclude typical laptop computers. While described with regards to a handheld device, many embodiments are usable with portable devices which are not handheld and/or with non-portable devices/systems. The teachings herein can be applied to other mobile computing devices or other electronic devices (e.g., a laptop computer, a desktop personal computer, a wireless headset, a digital memo recorder, an internet protocol (IP) telephone, a desktop telephone, a home or office security system, etc.).

Personal digital assistants are configured to synchronize personal information from one or more applications with a remote computer (e.g., desktop, laptop, server, etc.) over a wired or wireless connection.

According to an exemplary embodiment, mobile computing device 10 comprises a housing 12 configured to hold a display 14 (e.g., a display screen) in a fixed relationship above a user input device 16 (e.g., a plurality of alphabetic input keys) in a substantially parallel or same plane. This fixed relationship embodiment excludes a hinged or movable relationship between the screen and plurality of keys.

Housing 12 could be any size, shape, dimension, and material (e.g., plastic, metal, etc.) and comprises a front side 18 and a back side 20. In some embodiments, housing 12 has a width (shorter dimension) 13 of no more than about 200 mm or no more than about 100 mm, or a width 13 of at least about 30 mm or at least about 50 mm. In some embodiments, housing 12 has a length (longer dimension) 15 of no more than about 200 mm or no more than about 150 mm, or a length 15 of at least about 70 mm or at least about 100 mm. In some embodiments, housing 12 has a thickness (smallest dimension) 17 of no more than about 150 mm or no more than about 50 mm, or a thickness 17 of at least about 10 mm or at least about 15 mm. In some embodiments, housing 12 has a volume of up to about 2500 cubic centimeters and/or up to about 1500 cubic centimeters.

Device 10 further comprises an earpiece speaker 22, loudspeaker 24, and microphone 28. Earpiece speaker 22 may be an electro-acoustic transducer configured to provide audio output with a volume suitable for a user placing earpiece 22 against or near the ear. Loudspeaker 24 may be an electro-acoustic transducer that converts electrical signals into sounds loud enough to be heard at a distance. Loudspeaker 24 can be used for a speakerphone function. Microphone 28 (e.g., a surface mount or other microphone) or other acoustic sense element is coupled to a bottom edge 26 of housing 12. In alternative embodiments, display 14, user input device 16, earpiece 22, loudspeaker 24, and microphone 28 may each be positioned anywhere on front side 18, back side 20 or the edges there between.

Device 10 may provide voice communications functionality in accordance with different types of cellular radiotelephone systems. Examples of cellular radiotelephone systems may include Code Division Multiple Access (CDMA) cellular radiotelephone communication systems, Global System for Mobile Communications (GSM) cellular radiotelephone systems, etc.

In addition to voice communications functionality, device 10 may be configured to provide data communications functionality in accordance with different types of cellular radiotelephone systems. Examples of cellular radiotelephone systems offering data communications services may include GSM with General Packet Radio Service (GPRS) systems (GSM/GPRS), CDMA/1xRTT systems, Enhanced Data Rates for Global Evolution (EDGE) systems, Evolution Data Only or Evolution Data Optimized (EV-DO) systems, etc.

Device 10 may be configured to provide voice and/or data communications functionality in accordance with different types of wireless network systems. Examples of wireless network systems may further include a wireless local area network (WLAN) system, wireless metropolitan area network (WMAN) system, wireless wide area network (WWAN) system, and so forth. Examples of suitable wireless network systems offering data communication services may include the Institute of Electrical and Electronics Engineers (IEEE) 802.xx series of protocols, such as the IEEE 802.11a/b/g/n series of standard protocols and variants (also referred to as "WiFi"), the IEEE 802.16 series of standard protocols and variants (also referred to as "WiMAX"), the IEEE 802.20 series of standard protocols and variants, and so forth.

Device 10 may be configured to perform data communications in accordance with different types of shorter range wireless systems, such as a wireless personal area network (PAN) system. One example of a suitable wireless PAN system offering data communication services may include a Bluetooth system operating in accordance with the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth.

Figure 3:
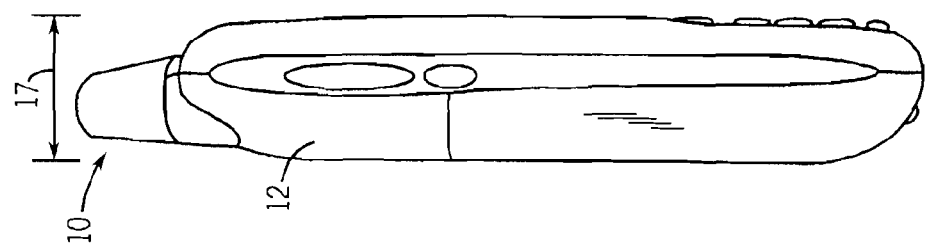
FIG. 3 is a side view of a mobile computing device, according to an exemplary embodiment.
Figure 2:
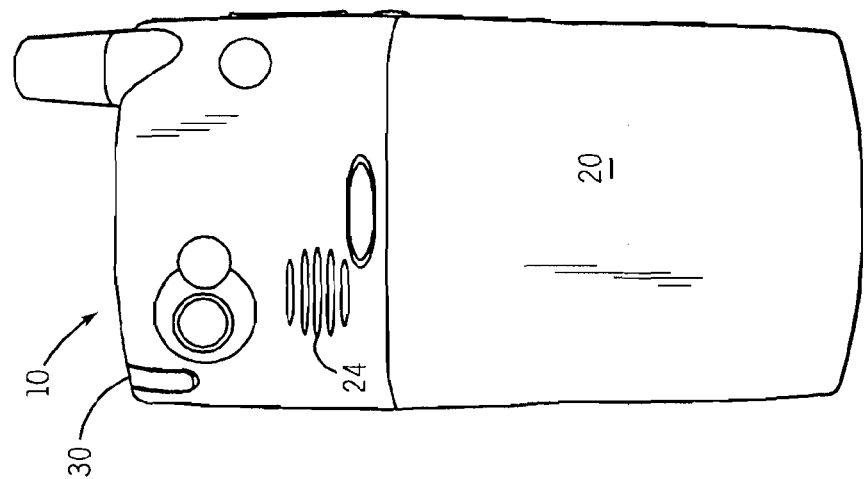
FIG. 2 is a back view of a mobile computing device, according to an exemplary embodiment.

As shown in the embodiment of FIG. 3, device 10 may comprise a processing circuit 101 comprising various electronic components, such as a dual processor architecture including a host processor 102 and a radio processor 104 (e.g., a base band processor). The host processor 102 and the radio processor 104 may be configured to communicate with each other using interfaces 106 such as one or more universal serial bus (USB) interfaces, micro-USB interfaces, universal asynchronous receiver-transmitter (UART) interfaces, general purpose input/output (GPIO) interfaces, control/status lines, control/data lines, shared memory, and so forth.

The host processor 102 may be responsible for executing various software programs such as application programs and system programs to provide computing and processing operations for device 100. The radio processor 104 may be responsible for performing various voice and data communications operations for device 100 such as transmitting and receiving voice and data information over one or more wireless communications channels. Although embodiments of the dual processor architecture may be described as comprising the host processor 102 and the radio processor 104 for purposes of illustration, the dual processor architecture of device 100 may comprise additional processors, may be implemented as a dual- or multi-core chip with both host processor 102 and radio processor 104 on a single chip, etc.

The host processor 102 may be configured to provide processing or computing resources to device 100. For example, the host processor 102 may be responsible for executing various software programs such as application programs and system programs to provide computing and processing operations for device 100. Examples of application programs may include, for example, a telephone application, voicemail application, e-mail application, instant message (IM) application, short message service (SMS) application, multimedia message service (MMS) application, web browser application, personal information manager (PIM) application, contact management application, calendar application, scheduling application, task management application, word processing application, spreadsheet application, database application, video player application, audio player application, multimedia player application, digital camera application, video camera application, media management application, a gaming application, and so forth. The application software may provide a graphical user interface (GUI) to communicate information between device 100 and a user.

System programs assist in the running of a computer system. System programs may be directly responsible for controlling, integrating, and managing the individual hardware components of the computer system. Examples of system programs may include, for example, an operating system (OS), device drivers, programming tools, utility programs, software libraries, an application programming interface (API), graphical user interface (GUI), etc. Device 100 may utilize any suitable OS in accordance with the described embodiments such as a Palm OS®, Palm OS® Cobalt, Microsoft® Windows OS, Microsoft Windows® CE, Microsoft Pocket PC, Microsoft Mobile, Symbian OS™, Embedix OS, Linux, Binary Run-time Environment for Wireless (BREW) OS, JavaOS, a Wireless Application Protocol (WAP) OS, etc. The operating system may be an open-platform operating system to receive and operate additional applications provided to device 10 after manufacture, e.g., via wired or wireless download, Secure Digital card, etc.

Device 10 may comprise a memory 108 coupled to the host processor 102. In various embodiments, the memory 108 may be configured to store one or more software programs to be executed by the host processor 102. The memory 108 may be implemented using any machine-readable or computer-readable media capable of storing data such as volatile memory or non-volatile memory, removable or non-removable memory, erasable or non-erasable memory, writeable or re-writeable memory, and so forth. Although the memory 108 may be shown as being separate from the host processor 102 for purposes of illustration, in various embodiments some portion or the entire memory 108 may be included on the same integrated circuit as the host processor 102. Alternatively, some portion or the entire memory 108 may be disposed on an integrated circuit or other medium (e.g., hard disk drive) external to the integrated circuit of host processor 102. In various embodiments, device 10 may comprise an expansion slot to support a multimedia and/or memory card, for example.

User input device 16 may comprise, for example, a QWERTY key layout and an integrated number dial pad. Device 16 also may comprise various keys, buttons, and switches such as, for example, input keys, preset and programmable hot keys, left and right action buttons, a navigation button such as a multidirectional navigation button, phone/send and power/end buttons, preset and programmable shortcut buttons, a volume rocker switch, a ringer on/off switch having a vibrate mode, a keypad, an alphanumeric keypad, and so forth.

Display 14 may comprise any suitable visual interface for displaying content to a user of device 10. For example, the display 14 may be implemented by a liquid crystal display (LCD) such as a touch-sensitive color (e.g., 16-bit color) thin-film transistor (TFT) LCD screen. In some embodiments, the touch-sensitive LCD may be used with a stylus 30 and/or a handwriting recognizer program.

Device 10 may comprise an input/output (I/O) interface 114 coupled to the host processor 102. The I/O interface 114 may comprise one or more I/O devices such as a serial connection port, an infrared port, integrated Bluetooth® wireless capability, and/or integrated 802.11x (WiFi) wireless capability, to enable wired (e.g., USB cable) and/or wireless connection to a local computer system, such as a local personal computer (PC). In various implementations, device 10 may be configured to transfer and/or synchronize information with the local computer system.

The host processor 102 may be coupled to various audio/video (A/V) devices 116 that support A/V capability of device 10. Examples of A/V devices 116 may include, for example, a microphone, one or more speakers, an audio port to connect an audio headset, an audio coder/decoder (codec), an audio player, a digital camera, a video camera, a video codec, a video player, and so forth.

The host processor 102 may be coupled to a power supply 118 configured to supply and manage power to the elements of device 10. In various embodiments, the power supply 118 may be implemented by a rechargeable battery, such as a removable and rechargeable lithium ion battery to provide direct current (DC) power, and/or an alternating current (AC) adapter to draw power from a standard AC main power supply.

Device 10 may comprise a transceiver module 120 coupled to the radio processor 104. The transceiver module 120 may comprise one or more transceivers configured to communicate using different types of protocols, communication ranges, operating power requirements, RF sub-bands, information types (e.g., voice or data), use scenarios, applications, and so forth. In various embodiments, the transceiver module 120 may comprise one or more transceivers configured to support voice communication for a cellular radiotelephone system such as a GSM, UMTS, and/or CDMA system. The transceiver module 120 also may comprise one or more transceivers configured to perform data communications in accordance with one or more wireless communications protocols such as WWAN protocols (e.g., GSM/GPRS protocols, CDMA/1xRTT protocols, EDGE protocols, EV-DO protocols, EV-DV protocols, HSDPA protocols, etc.), WLAN protocols (e.g., IEEE 802.11a/b/g/n, IEEE 802.16, IEEE 802.20, etc.), PAN protocols, Infrared protocols, Bluetooth protocols, EMI protocols including passive or active RFID protocols, and so forth.

The transceiver module 120 may be implemented using one or more chips as desired for a given implementation. Although the transceiver module 120 may be shown as being separate from and external to the radio processor 104 for purposes of illustration, in various embodiments some portion or the entire transceiver module 120 may be included on the same integrated circuit as the radio processor 104.

Device 10 may comprise an antenna system 32 for transmitting and/or receiving electrical signals. As shown, the antenna system 32 may be coupled to the radio processor 104 through the transceiver module 120. The antenna system 32 may comprise or be implemented as one or more internal antennas and/or external antennas.

In various embodiments, device 100 may comprise a location or position determination circuit 134.

Figure 5:
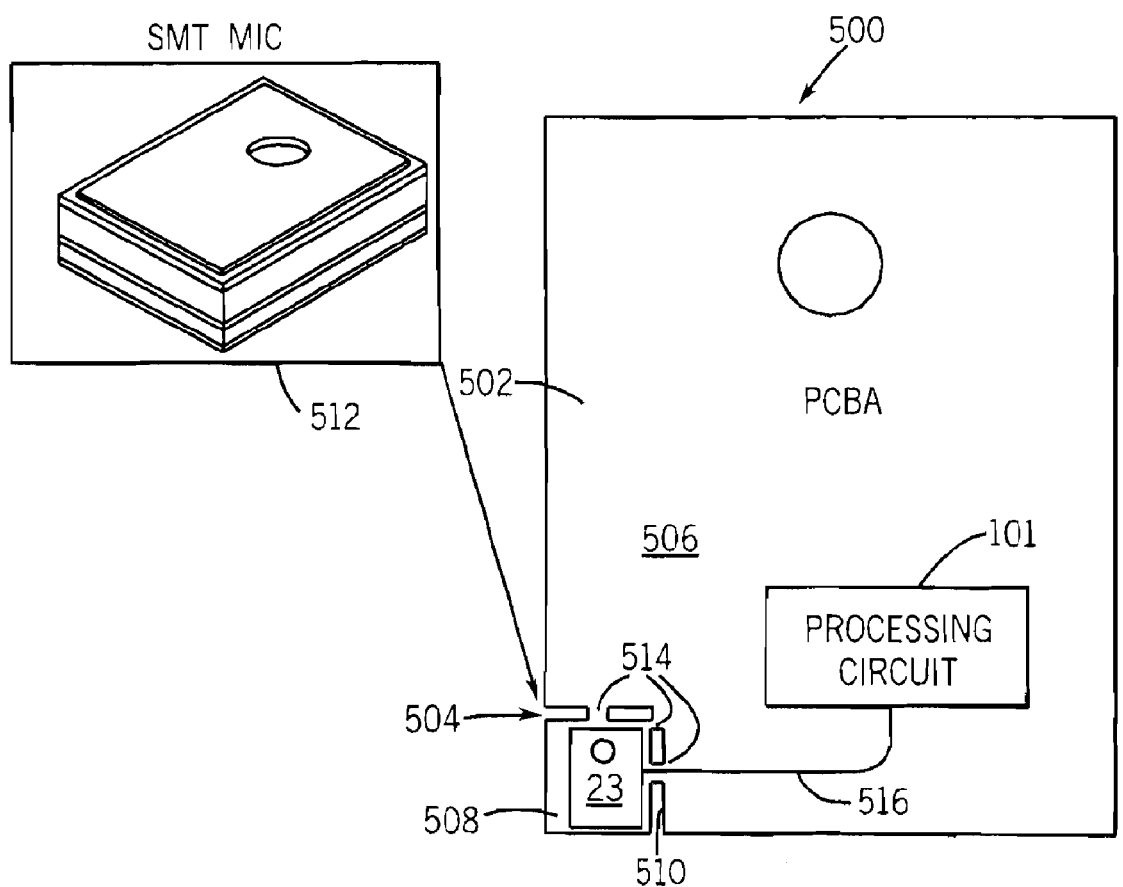
FIG. 5 is an illustration of a printed circuit board assembly, according to an exemplary embodiment.

Referring now to FIG. 5, a printed circuit board assembly 500 comprising a printed circuit board 502 is shown, according to an exemplary embodiment. PCB 502 may alternatively be any type of substrate configured to hold electronic components in an electronic device. Any of the electronic components disclosed in FIGS. 1-4, or other components, may be disposed on PCB 502, which may be a single PCB or a plurality of PCBs, e.g., which may be coupled together by one or more ribbon cables, flex circuits, etc.

PCB 502 comprises a vibration attenuation portion 504 configured to attenuate vibrations from a first portion of PCB 506 to a second portion of PCB 508. In this exemplary embodiment, vibration attenuation portion 504 comprises a portion of PCB which defines at least one aperture 510 between first and second portions 506, 508. Aperture 510 attenuates or blocks waves traveling between portions 506 and 508 because sound waves will not travel as well through air as they will along the substrate of PCB 502. In alternative embodiments, a plurality of apertures may be defined, which may be perforations or slots and may be elongated or non-elongated. In further alternative embodiments, vibration attenuation portion 504 can comprise a material extending between first and second portions 506, 508 which may or may not contain apertures or perforations, which material may be an acoustic insulating material, a vibration isolating material, a shock absorbing material, and/or a material which is different than the material of portions 506, 508. Vibration attenuation portion 504 can comprise an elastomer, polymer, rubber, sponge, or other material. Any of these materials or others, or apertures or perforations may be means for reducing vibrations between first and second portions 506, 508. Vibration attenuation portion 504 can attenuate or isolate a small amount of vibration, a large amount of vibration, or all vibrations in various embodiments.

Referring again to FIG. 5, microphone 28 is coupled to second portion 508. Microphone 28 may be a surface mount microphone, as shown in illustration 512, which is a microphone which is compatible with common surface mount equipment and may be placed on a PCB during the same assembly step during which other surface mount components are placed. According to some embodiments, a surface mount microphone may be picked-and-placed from a tape-and-reel. The surface-mount microphone may be wave soldered along with integrated circuits and passive components. A surface mount microphone provides a more reliable, repeatable connection without the need for a hand assembly process or a connector and with less chance of electrostatic discharge (ESD) related damage. Microphone 28 may be any type of microphone, such as a condenser or capacitor, dynamic, carbon, piezo, liquid, Microelectromechanical System (MEMS) or silicon, laser, or speaker microphone. For example, microphone 28 may be an electret condenser microphone (ECM), which may or may not have leads and which may be coupled to a PCB by spring contacts or elastomer connections during mechanical assembly of the product, after PCB reflow. The ECM may comprise a cartridge within a cylinder within a rubber case. A surface mount microphone may comprise an electret condenser sense element, a silicon or MEMS sense element, or any other sensing technology. One example is a SiSonic™ silicon microphone, a MEMS surface mount microphone manufactured by Knowles Acoustics, Itasca, Ill., such as the one shown in illustration 512. The exemplary surface-mount microphone shown in illustration 512 comprises a package having leadless, conductive contacts which mount to conductive contacts on PCB 502 and a rectangular package (though other shaped packages are contemplated). A SiSonic™ microphone contains a MEMS diaphragm, a complimentary metal-oxide-semicondutor (CMOS) amplifier, and various capacitor configurations encased in a grounded metal 'Faraday' cage. Electrically, a SiSonic™ microphone is a three-wire microphone (ECMs are typically two wire). The teachings herein may be particularly advantageous for certain types of microphones, such as surface-mount microphones or other surface mount components, which tend to be affected more by vibrations and noise traveling along the surface of PCB 502 than their leaded counterparts.

According to some embodiments, vibration attenuation portion 504 comprises at least one bridge 514 extending between apertures 510. Bridges 514 may be of any size, thickness, or shape, and may be of sufficient size to support portion 508 without easily breaking. For example, an exemplary PCB 502 having from about 6 to about 8 layers may be about 1 millimeter thick. An exemplary width and length of an aperture of vibration attenuation portion 504 is about 1 millimeter wide and about 0.5 millimeter long, though widths less than or greater than about 1 millimeter wide and/or lengths of less than or greater than about 0.5 millimeter long are contemplated. In various embodiments, bridges 514 may provide support for portion 508 and may provide a path for conductors or wires 516 extending between microphone 28 and components on portion 506. For example, microphone 28 may be coupled via conductors 516 extending on the top, bottom, or through the middle of bridges 514 to processing circuit 101.

In the embodiment of FIG. 5, processing circuit 101 is disposed on first portion 506 and microphone 28 is disposed on second portion 508. In some embodiments, input device 16 is also coupled to first portion 506, so that vibrations caused by key presses are attenuated before reaching microphone 28. In some embodiments, first portion 506 is coupled to housing 12 (e.g., with a suitable fastener or fasteners, such as a screw, adhesive, mount, etc.) while second portion 508 is not coupled to housing, so that vibrations caused by hand movement or rubbing of housing 12 are attenuated by vibrating attenuation portion 514 before reaching microphone 28. In some embodiments, other electrical or electromechanical components may be coupled to portion 508 along with microphone 28, for example, a microprocessor, a radio circuit, a keypad, a light-emitting diode, connectors for a Subscriber Identity Module (SIM) card, connectors for a multi-media card (MMC) or other memory cards, backup battery, switches, light or proximity detectors, passive electronic components, radio antenna, Bluetooth or wi-fi module, headset connector, etc. Alternatively, microphone 28 may be the only component coupled to portion 21.

Figure 6A:
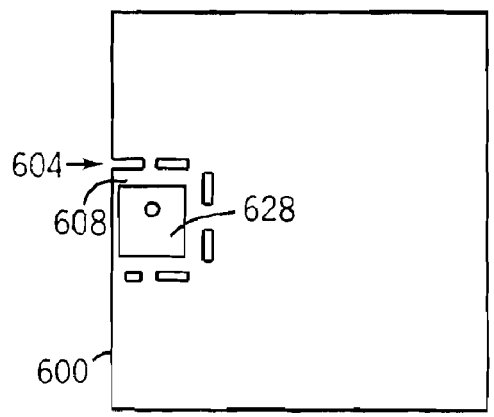
Figure 6B:
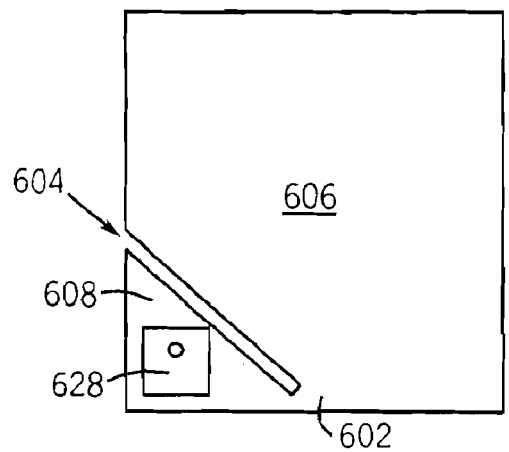
Figure 6C:
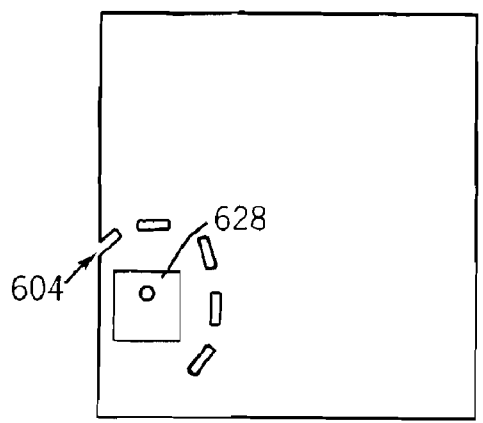
Figure 6D:
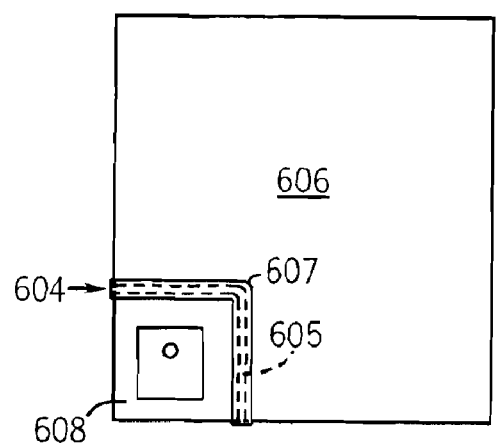
Figure 6E:
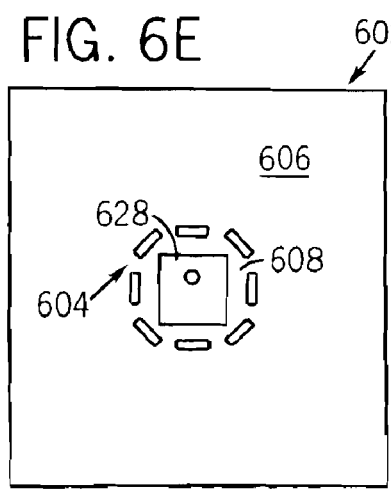
Figure 6F:
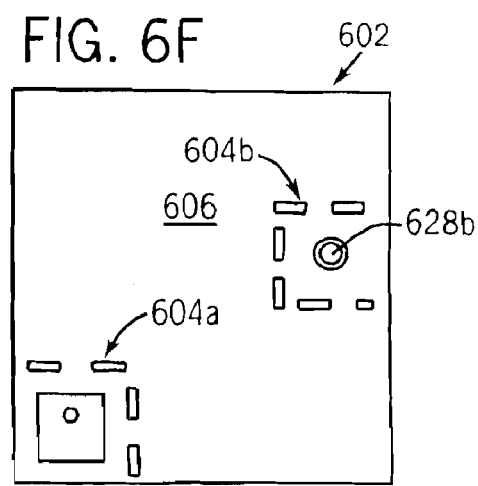

Referring now to FIGS. 6A-6G, various configurations of vibration attenuation portion 604 are illustrated. FIG. 6A shows an embodiment in which second portion 608 extends to at least one edge 600 of PCB 602 and vibration attenuation portion 504 substantially surrounds microphone 628 along with the at least one edge. FIG. 6B shows an embodiment in which vibration attenuation portion 604 comprises a single aperture or recess and a single bridge portion 602 connecting portions 606 and 608. In this embodiment, microphone 628 is disposed substantially in a corner of PCB 602. FIG. 6C shows an embodiment in which vibration attenuation portion 604 is curved and does not substantially surround microphone 628, but still provides a level of vibration attenuation. FIG. 6D shows an embodiment in which vibration attenuation portion 604 comprises a material 607 coupling portion 606 to portion 608. In this embodiment, an aperture 605 may completely (or partially) separate portion 606 from 608, and material 607 may wholly or partially couple portion 606 to portion 608. FIG. 6E shows an embodiment in which attenuation portion 604 substantially surrounds microphone 628 and microphone 628 is disposed without a common edge with PCB 602. In this embodiment, portion 608 is substantially surrounded by portion 606. FIG. 6F shows an embodiment having a plurality of portions at least partially isolated from PCB 602 by vibration attenuation portions 604*a*, 604*b*, and in which microphone 628*b* is a leaded ECM microphone having a cartridge and cylinder arrangement. FIG. 6G shows an embodiment having a vibration attenuation portion 604 extending from one edge 660 to an opposite edge 662 of PCB 604. As can be seen, many alternative configurations are contemplated.

Figure 7:
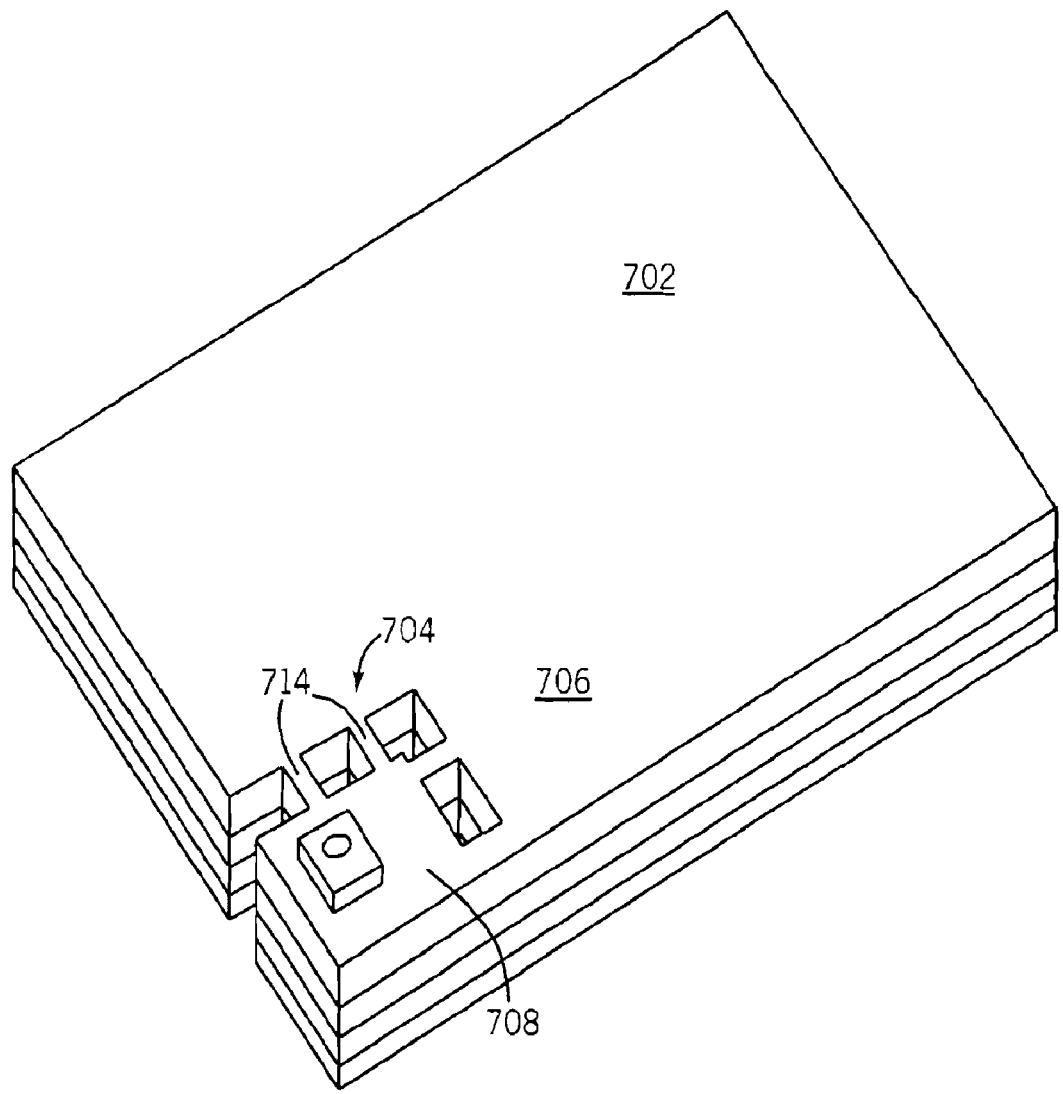
FIG. 7 is a perspective view of a multilayer PCB, according to an exemplary embodiment.

Referring now to FIG. 7, an embodiment is shown in which PCB 702 is a multi-layer PCB which may have any number of a plurality of layers, such as at least six layers and less than ten layers. In some embodiments, multi-layer PCB may have two or more layers. In this embodiment, vibration attenuation portion 704 (e.g., apertures or perforations in this embodiment) extends through all layers of PCB 702, though in alternative embodiments portion 704 may extend only through one or a plurality of all layers. Conductors may extend along any or all layers of multi-layer PCB 702 at bridges between first portion 706 and second portion 708.

Referring now to FIG. 8, an embodiment is shown in which microphone 828 (or other component on portion 808) is sealed, encased and/or encapsulated within a shock absorbing or stabilizing material 850. Shock absorbing material 850 may absorb movement, vibration, or acoustic waves and may comprise one or more of a rubber, a polymer, an elastomer, a sponge or other material and may be a mass of any shape, such as a gasket. Shock absorbing material 850 completely encapsulates microphone 828 in this embodiment, but may alternatively only partially encapsulate microphone 828, or may completely or partially encapsulate portion 808 of PCB 802. Material 850 may also be disposed on a bottom surface 852 of PCB beneath microphone 828, as shown in FIG. 8C. Material 850 on bottom surface 852 is compressed against housing 12. To maintain compression, pressure is exerted from housing 12 (a rear portion thereof) on bottom surface 852 behind microphone 828. Shock absorbing material 850 may be applied to reduce coupling from housing 12 to bottom surface 852.

According to some embodiments, an aperture or recess 854 extends from an audio or sound inlet or aperture 856 within a housing of microphone 828 through, material 850 to another surface of material 850. An outlet of aperture 854 can be aligned with an aperture in housing 12 disposed near the expected area of input of an audio signal (e.g., near the bottom edge 26 of housing 12, FIG. 1). In this way, acoustic signals can travel through material 850 to microphone 828 unimpeded by material 850.

Figure 9:
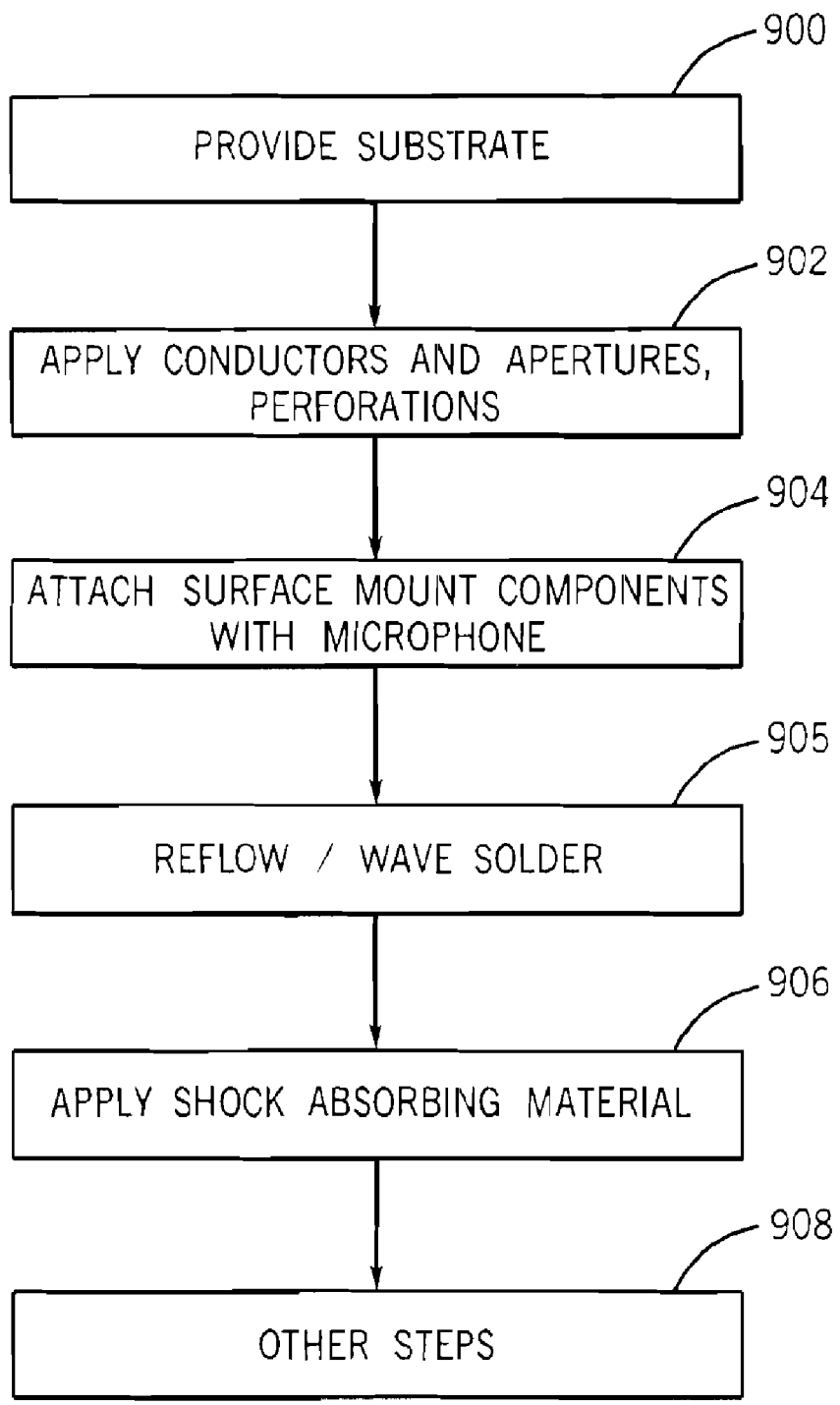
FIG. 9 is a flowchart illustrating a method of manufacturing a PCB assembly, according to an exemplary embodiment.

Referring now to FIG. 9, an exemplary method of making a printed circuit board assembly according to an exemplary embodiment is disclosed. At step 900, a substrate is provided suitable for a printed circuit board. At step 902, conductors, apertures and perforations are provided by machining, routing, lithography, and other processes. In an embodiment wherein vibration attenuation portion comprises apertures or perforations, such features are machined or routed during this step, and may be routed using a computer-controlled router. At step 904, surface-mount components are attached to the PCB to form the PCB assembly. Advantageously, in an embodiment where microphone 28 is a surface-mount microphone, the microphone may be applied or attached during the same process step as other surface-mount components. In an embodiment where microphone 28 is a surface-mount microphone, the microphone may be placed by a machine instead of by a person. At step 905, the surface-mount components are reflowed or wave soldered. At step 906, shock absorbing material can be applied to microphone 28 and/or second portion 508 of PCB 502. Other steps are represented by step 908, such as applying other non-surface-mount components (e.g., through-hole components, etc). The steps of FIG. 9 may be rearranged in any manner in various alternative embodiments.

While the exemplary embodiments illustrated in the FIGS, and described above are presently exemplary, it should be understood that these embodiments are offered by way of example only. Accordingly, the present invention is not limited to a particular embodiment, but extends to various modifications that nevertheless fall within the scope of the appended claims.

What is claimed is:
1. An electronic device, comprising:
   a printed circuit board defining at least one elongated aperture between a first portion and a second portion of the printed circuit board; and
   a microphone coupled to the first portion of the printed circuit board and at least one other electronic component coupled to the second portion of the printed circuit board, the at least one elongated aperture substantially surrounding the microphone to attenuate vibrations traveling along the second portion of the printed circuit board.

2. The electronic device of claim 1, further comprising a mobile telephony circuit coupled to the microphone.

3. The electronic device of claim 2, further comprising a processing circuit configured to operate a plurality of personal information management applications and to wirelessly synchronize personal data with a remote computer.

4. The electronic device of claim 1, wherein the second portion is disposed in a corner of the printed circuit board.

5. The electronic device of claim 1, wherein the printed circuit board defines at least one bridge adjacent to the at least one elongated aperture, further comprising a conductor extending from the microphone to the at least one other electronic component along the at least one bridge.

6. The electronic device of claim 1, wherein the printed circuit board comprises a plurality of layers, wherein the aperture extends through all of the plurality of layers.

7. The electronic device of claim 1, further comprising at least one additional electronic component coupled to the second portion of the printed circuit board.

8. The electronic device of claim 1, wherein the printed circuit board defines a plurality of elongated apertures substantially isolating the first portion of the printed circuit board from the second portion of the printed circuit board.

9. The electronic device of claim 1, further comprising a shock absorbing substrate disposed over the microphone and defining an aperture extending from an audio input on the microphone through the substrate to a housing of the electronic device.

10. The electronic device of claim 1, wherein the microphone is a surface mount microphone.

11. The electronic device of claim 10, further comprising a shock absorbing substrate encapsulating the surface mount microphone on both sides of the printed circuit board.

12. A mobile computing device, comprising:
a printed circuit board;
a processing circuit disposed on a first portion of the printed circuit board;
a surface mount microphone disposed on a second portion of the printed circuit board; and
a vibration attenuation portion of the printed circuit board to attenuate vibrations from the first to the second portion of the printed circuit board, the vibration attenuation portion comprising perforations in the printed circuit board.

13. The mobile computing device of claim 12, wherein the vibration attenuation portion of the board comprises bridges between the perforations, at least one of the bridges carrying a conductor extending between the surface mount microphone and an electronic component on the first portion of the printed circuit board.

14. The mobile computing device of claim 12, wherein the second portion of the printed circuit board extends to at least one edge of the printed circuit board and the vibration attenuation portion substantially surrounds the surface mount microphone along with the at least one edge.

15. The mobile computing device of claim 12, further comprising a housing coupled with the printed circuit board, the housing configured to be carried in the hand of a user.

16. The mobile computing device of claim 12, further comprising a mobile telephony circuit coupled to the microphone.

* * * * *